United States Patent
Lee et al.

(10) Patent No.: US 10,468,409 B2
(45) Date of Patent: Nov. 5, 2019

(54) FINFET DEVICE WITH OXIDATION-RESIST STI LINER STRUCTURE

(71) Applicant: Taiwan Semiconductor Manufacturing Co., Ltd., Hsinchu (TW)

(72) Inventors: Szu-Ping Lee, Changhua County (TW); Jian-Shiou Huang, Fangliao Township, Pingtung County (TW); Chih-Tang Peng, Zhubei (TW); Sung-En Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/920,967

(22) Filed: Mar. 14, 2018

(65) Prior Publication Data

US 2019/0287971 A1  Sep. 19, 2019

(51) Int. Cl.

| H01L 27/088 | (2006.01) |
|---|---|
| H01L 27/092 | (2006.01) |
| H01L 29/06 | (2006.01) |
| H01L 21/8238 | (2006.01) |
| H01L 29/78 | (2006.01) |
| H01L 29/417 | (2006.01) |
| H01L 29/66 | (2006.01) |

(Continued)

(52) U.S. Cl.
CPC .. *H01L 27/0886* (2013.01); *H01L 21/823431* (2013.01); *H01L 21/823821* (2013.01); *H01L 21/823878* (2013.01); *H01L 27/0924* (2013.01); *H01L 27/10879* (2013.01); *H01L 29/0649* (2013.01); *H01L 29/41791* (2013.01); *H01L 29/66795* (2013.01); *H01L 29/7849* (2013.01)

(58) Field of Classification Search
CPC ..... H01L 21/823431; H01L 21/823821; H01L 21/845; H01L 27/0886; H01L 27/0924; H01L 27/10879; H01L 27/1211; H01L 29/41791; H01L 29/66772; H01L 29/66795; H01L 29/7831; H01L 29/785; H01L 29/786
See application file for complete search history.

(56) References Cited

U.S. PATENT DOCUMENTS

| 8,796,666 B1 | 8/2014 | Huang et al. |
| 8,815,712 B2 | 8/2014 | Wan et al. |
| 8,963,258 B2 | 2/2015 | Yu et al. |

(Continued)

*Primary Examiner* — Eduardo A Rodela
(74) *Attorney, Agent, or Firm* — McClure, Qualey & Rodack, LLP

(57) ABSTRACT

A semiconductor device structure is provided. The semiconductor device structure includes a fin structure protruding from a semiconductor substrate. The fin structure includes a first portion and an overlying second portion. The first portion is formed of a material that is the same as that of the semiconductor substrate and different from that of the second portion. The semiconductor device structure also includes a liner structure and an isolation feature. The liner structure includes a carbon-doped silicon oxide film covering the semiconductor substrate and the first portion of the first fin structure and a nitrogen-containing film over the carbon-doped silicon oxide film. The isolation feature is over the nitrogen-containing film and surrounded by the liner structure.

20 Claims, 10 Drawing Sheets

(51) Int. Cl.
*H01L 21/8234* (2006.01)
*H01L 27/108* (2006.01)

(56) References Cited

U.S. PATENT DOCUMENTS

| | | | |
|---|---|---|---|
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,576,814 | B2 | 2/2017 | Wu et al. |
| 2007/0037380 | A1* | 2/2007 | Torres ................. H01L 21/7682 438/619 |
| 2008/0090378 | A1* | 4/2008 | Tsunoda ............ H01L 21/76224 438/425 |
| 2008/0305647 | A1* | 12/2008 | Matsushita ............... C23C 8/02 438/791 |
| 2010/0032756 | A1* | 2/2010 | Pendharkar ........... H01L 21/761 257/337 |
| 2011/0156107 | A1* | 6/2011 | Bohr ................. H01L 21/76831 257/288 |
| 2014/0353760 | A1* | 12/2014 | Loubet ............ H01L 21/823821 257/369 |
| 2015/0228534 | A1* | 8/2015 | Wu ................... H01L 21/76224 257/506 |
| 2016/0104799 | A1* | 4/2016 | Qi ...................... H01L 29/7849 257/29 |
| 2018/0197789 | A1* | 7/2018 | Glass ............. H01L 21/823807 |
| 2018/0248015 | A1* | 8/2018 | Glass ..................... H01L 29/78 |

\* cited by examiner

FINFET DEVICE WITH OXIDATION-RESIST STI LINER STRUCTURE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFETs and methods of fabricating FinFETs have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
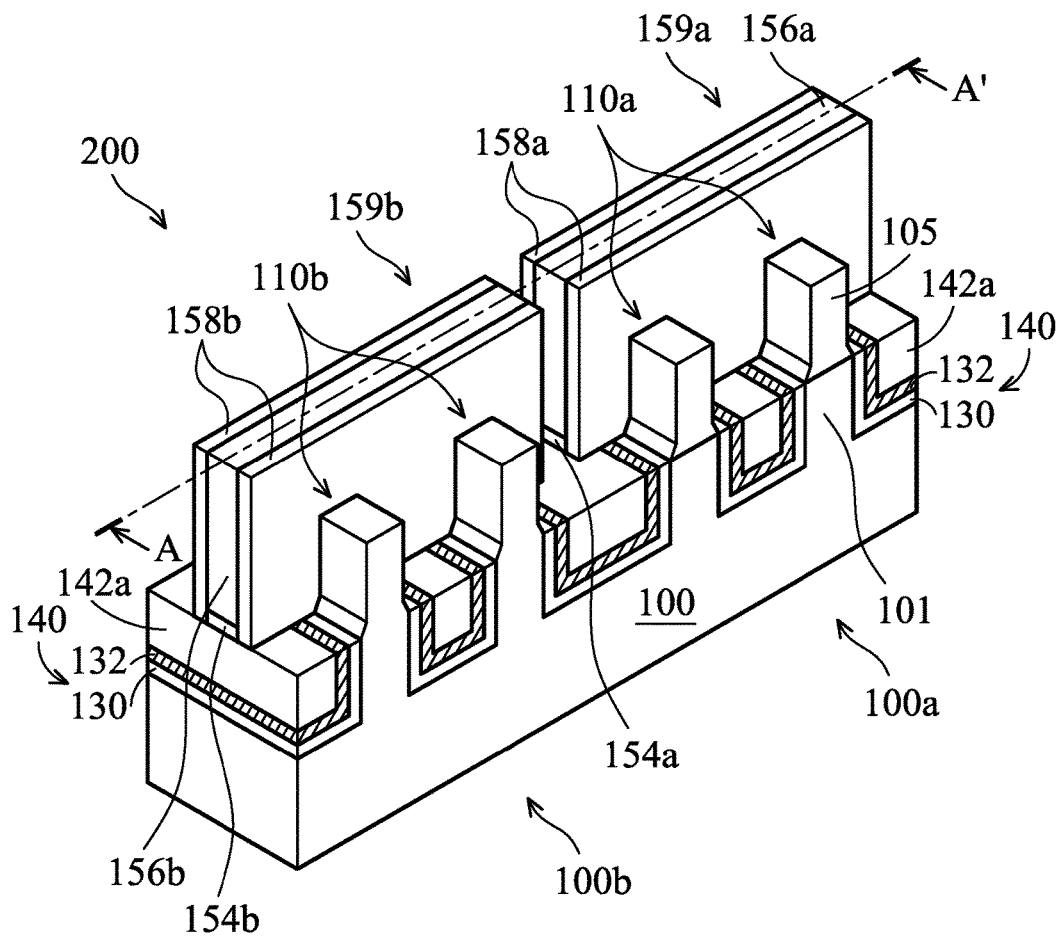
FIG. 1 is a perspective view of a semiconductor device structure with fin field-effect transistors (FinFETs) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments of a semiconductor device structure and a method for forming the same are provided. FIG. 1 is a perspective view of a semiconductor device structure 200 including fin field-effect transistors (FinFETs) in accordance with some embodiments. FIGS. 2, 3, 4, 5, 6, 7, 8, and 9 are cross-sectional views along line A-A' of FIG. 1 to show various stages of a process for forming the semiconductor device structure 200, in accordance with some embodiments. In some embodiments, a gate-replacement process is employed to fabricate the semiconductor device structure 200.

FIG. 1 is a perspective view of a semiconductor device structure 200 with FinFETs in accordance with some embodiments. The semiconductor device structure 200 includes a semiconductor substrate 100 having a first region 100a (e.g. a PMOS region) for P-type FinFETs formed thereon and a second region 100b (e.g. an NMOS region) for N-type FinFETs formed thereon. In some embodiments, the first region 100a of the semiconductor substrate 100 includes a semiconductor material (e.g. an III-V group or IV group semiconductor material) that is different from the semiconductor substrate 100 (e.g. silicon). For example, the III-V group or IV group semiconductor material may include GaN, GaAs, InP, AlGaN, InAs or the like, and the IV group semiconductor material may include Si, Ge, or a combination thereof, or the like.

In some embodiments, one or more first fin structures 110a may be formed protruding from the first region 100a of the semiconductor substrate 100 and one or more second fin structures 110b may be formed protruding from the second region 100b of the semiconductor substrate 100. For example, the first fin structure 110a may include a first portion 101 and an overlying second portion 105. Moreover, the first portion 101 may be formed of a material that is the same as that of the semiconductor substrate 100 (e.g. silicon) and different from that of the second portion 105 which may be formed of a semiconductor material, such as an III-V group or IV group semiconductor material (e.g., silicon germanium (SiGe)). In those cases, the second fin structure 110b may be formed of a material that is the same as that of the semiconductor substrate 100 (e.g. silicon).

In some embodiments, an isolation region may be positioned on opposing sides of the first portion 101 of the first fin structures 110a and opposing sides of the lower portion of the second fin structures 110b. In some embodiments, the isolation region includes an isolation feature 142a and a liner structure 140 covering the sidewall and the bottom of the isolation feature 142a, so that the semiconductor substrate 100, the first portion of the first fin structures 110a, and the lower portion of the second fin structures 110b are spaced apart from the isolation features 142a by the liner structures 140. Moreover, the isolation feature 142a is surrounded by the liner structure 140.

In some embodiments, the liner structure 140 includes a first liner layer 130 and a second liner layer 132 over the first liner layer 130. The first liner layer 130 may covers the semiconductor substrate 100, the first portion 101 of the first fin structures 110a in the first region 100a, and the lower portion of the second fin structures 110b in the second region 100b. The second liner layer 132 may be formed between the first liner layer 130 and the isolation feature 142a.

In some embodiments, the first liner layer 130 is a silicon oxide ($SiO_2$) film, a silicon carbide (SiC) film, or a carbon-doped silicon oxide (SiOC) film. In those cases, the second liner layer 132 may be a nitrogen-containing film or a carbon-containing film, such as a silicon nitride (SiN or $Si_3N_4$) film, a carbon-doped silicon nitride (SiCN) film, a silicon oxynitride (SiON) film, or a carbon-doped silicon oxynitride (SiCON) film.

In some embodiments, a gate structure 159a is positioned over the first fin structures 110a in the first region 100a of the semiconductor substrate 100. Similarly, a gate structure 159b is positioned over the second fin structures 110b in the second region 100b of the semiconductor substrate 100. In some embodiments, the gate structure 159a may include a dummy gate dielectric layer 154a, a dummy gate electrode layer 156a, and gate spacers 158a. The dummy gate electrode layer 156a is positioned over the dummy gate dielectric layer 154a. The gate spacers 158a may be formed on opposite sidewalls of the dummy gate electrode layer 156a and over the first fin structures 110a. Similarly, the gate structure 159b may include a dummy gate dielectric layer 154b, a dummy gate electrode layer 156b, and gate spacers 158b. The dummy gate electrode layer 156b is positioned over the dummy gate dielectric layer 154b. The gate spacers 158b may be formed on opposite sidewalls of the dummy gate electrode layer 156b and over the second fin structures 110b. In addition, source/drain features (not shown) may be formed on outer sidewalls of the gate spacers 158a and 158b.

Figure 2:
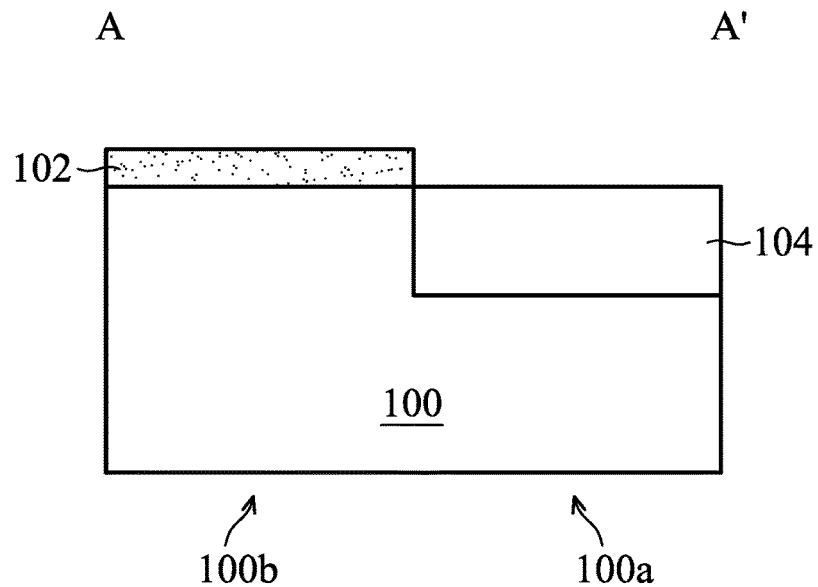
FIG. 2, FIG. 3, FIG. 4, FIG. 5, FIG. 6, FIG. 7, FIG. 8, and FIG. 9 are cross-sectional views showing various stages of a method of forming a semiconductor device structure with FinFETs in accordance with some embodiments.

As shown in FIG. 2, a semiconductor substrate 100 is received. In some embodiments, the semiconductor substrate 100 may be made of silicon or other semiconductor materials. In some embodiments, the semiconductor substrate 100 may be a bulk semiconductor, a semiconductor-on-insulator (SOI) substrate, or the like, which may be doped (e.g. with a P-type or an N-type dopant) or undoped. The semiconductor substrate 100 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate 100 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the semiconductor substrate 100 may include silicon.

In some embodiments, the semiconductor substrate 100 has a first region 100a and a second region 100b adjacent to the first region 100a. The first region 100a may be employed to form P-type devices, such as P-type metal-oxide-semiconductor field-effect transistors (MOSFETs). In those cases, the second region 100b may be employed to form N-type devices, such as N-type MOSFETs. Therefore, the first region 100a may be referred to as a PMOS region, and the second region 100b may be referred to as an NMOS region. In some other embodiments, P-type devices (or N-type devices) are formed in both the first region 100a and the second region 100b.

In some embodiments, a first well region (not shown), such as an N-Well region, is formed in the first region 100a of the semiconductor substrate 100 and a second well region (not shown), such as a P-Well region, is formed in the second region 100b of the semiconductor substrate 100. In those cases, a photoresist (not shown) may be formed over the second region 100b of the semiconductor substrate 100, and an ion implantation process may be performed on the first region 100a to form the first well region. Similarly, a photoresist (not shown) is formed over the first region 100a of the semiconductor substrate 100, and an ion implantation process is performed on the second region 100b to form the second well region. In some embodiments, the first well region is doped with arsenic (As) or phosphorous (P) ions to form the N-well region. In those cases, the second well portion 106 may be doped with boron (B) ions to form the P-well region.

Afterwards, a masking layer 102 covers the second region 100b and a portion of the semiconductor substrate 100 including silicon in the first region 100a is removed by an etching process (such as a wet etching process or a dry etching process) using the masking layer 102 as an etch mask, as shown in FIG. 2 in accordance with some embodiments. For example, the masking layer 102 may be a photoresist or a suitable hard mask material, may be formed over the semiconductor substrate 100 using a photolithography or deposition process. The photolithography process includes photoresist coating (e.g., spin-on coating), soft baking, mask aligning, exposure, post-exposure baking, developing the photoresist, rinsing and drying (e.g., hard baking). Moreover, the deposition process may include chemical vapor deposition (CVD), physical vapor deposition (PVD), or spin coating. The semiconductor substrate 100 in the first region 100a and exposed from the masking layer 102 is removed by a suitable dry etching process, such as reactive ion etch (RIE), neutral beam etch (NBE), the like, or a combination thereof, to form a recess (not shown) in the first region 100a.

Figure 3:
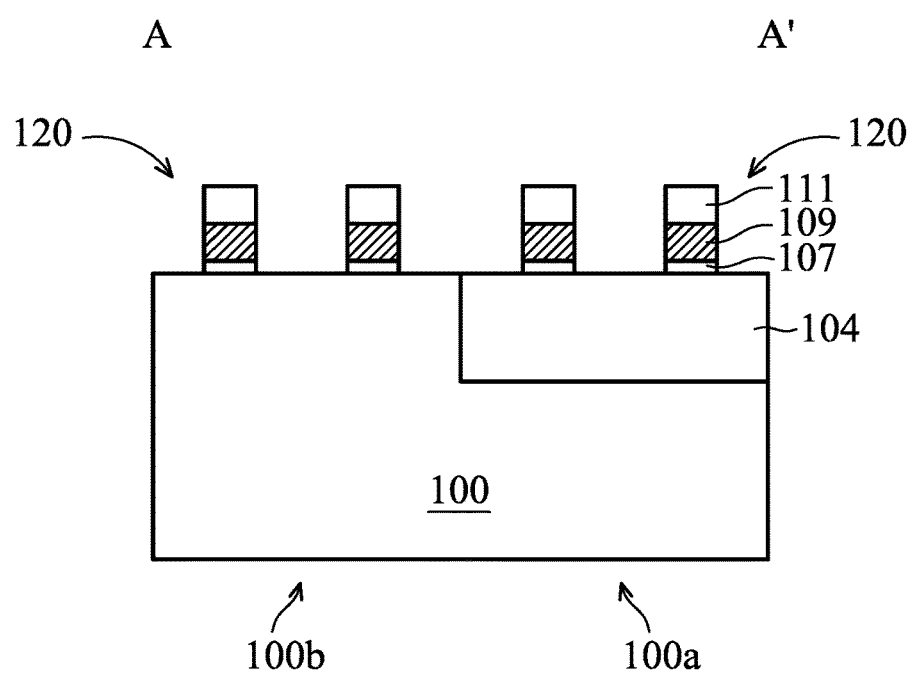

An III-V group or IV group semiconductor material 104 (for example, the III-V group or IV group semiconductor material may include GaN, GaAs, InP, AlGaN, InAs or the like, and the IV group semiconductor material may include Si, Ge, or a combination thereof, or the like) is epitaxially grown in the recess in the first region 100a by an epitaxial growth process, as shown in FIG. 2 in accordance with some embodiments. After forming the semiconductor material 104, the masking layer 102 may be removed by a suitable removal process, such as etching or plasma ashing, as shown in FIG. 3 in accordance with some embodiments. Afterwards, a planarization process, such as chemical mechanical polish (CMP), may be performed, so that the top surface of the semiconductor material 104 is substantially level with the top surface of the semiconductor substrate 100. The semiconductor material 104 (e.g., silicon germanium (SiGe)) in the first region 100a and a portion of the semiconductor substrate 100 (e.g., silicon (Si) material) in the second region 100b are employed to be a channel region below a gate structure. The silicon germanium (SiGe) having a compressive strain is suitable for providing increased carrier speed, i.e., increased hole carrier speed, for the channel region of P-type FinFET (i.e., PMOS device). The strained silicon (Si) material having intrinsic tensile strain is suitable for the channel region of N-type FinFET (i.e., NMOS device).

Figure 4:
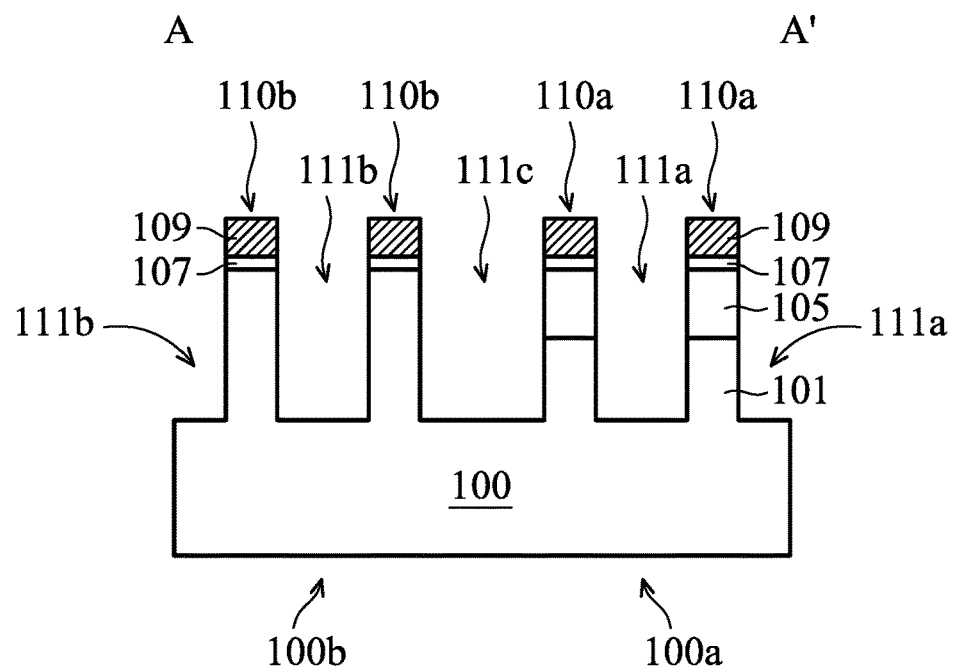

Afterwards, one or more first fin structures 110a are formed in the first region 100a of the semiconductor substrate 100 and one or more second fin structures 110b are formed in the second region 100b of the semiconductor substrate 100 by a patterning process, as shown in FIGS. 3 and 4 in accordance with some embodiments. As shown in FIG. 3, in some embodiments, a masking structure including a single layer or a multi-layer structure is provided over the semiconductor material 104 in the first region 110a and the semiconductor substrate 100 in the second region 110b. For example, a first silicon oxide layer 107, a silicon nitride layer 109, and a second silicon oxide layer 111 (which are sometimes referred to as an ONO masking structure) are successively formed over the semiconductor material 104 in the first region 110a and the semiconductor substrate 100 in the second region 110b by deposition processes. Such deposition processes may include a chemical vapor deposition (CVD) process, a high-density plasma chemical vapor deposition (HDPCVD) process, a spin-on process, a sputtering process, or another applicable process. In some embodiments, the first silicon oxide layer 107 is formed by a thermal oxidation process. In some embodiments, the silicon nitride layer 109 and the second silicon oxide layer 111 are replaced by a single layer including silicon oxynitride, silicon carbide, silicon carbonitride, or the like, and formed by a low-pressure chemical vapor deposition (LPCVD) process or a plasma enhanced chemical vapor deposition (PECVD) process, as examples. Alternatively, the masking structure includes the first silicon oxide layer 107 and the overlying silicon nitride layer 109 that is not covered by the second silicon oxide layer 111.

Afterwards, the masking structure including the first silicon oxide layer 107, the silicon nitride layer 109, and the second silicon oxide layer 111 are patterned by a patterning process to form a patterned masking structure 120 for definition of fin structures, as shown in FIG. 3, in accordance with some embodiments of the disclosure. Such a patterning process may include a photolithography process followed by an etching process (such as a dry etching process or a wet etching process).

An etching process (such as a dry or wet etching process) is performed on the semiconductor material 104 in the first region 110a and the semiconductor substrate 100 in the second region 110b using the patterned masking structure 120 as an etch mask, so as to form first fin structures 110a, second fin structures 110b, and trenches 111a, 111b, and 111c, as shown in FIG. 4 in accordance with some embodiments of the disclosure. In those cases, the trench 111a is formed in the III-V group or IV group semiconductor material 104 (as indicated in FIG. 3) and the underlying semiconductor substrate 100 in the first region 100a. The trench 111b is formed in the semiconductor substrate 100 in the second region 100b. The trench 111c is formed in the III-V group or IV group semiconductor material 104 (as indicated in FIG. 3) and the underlying semiconductor substrate 100 in the first region 100a and in the semiconductor substrate 100 in the second region 100b. As a result, the trench 111c is formed between the first fin structure 110a and the second fin structure 110b. After the first fin structures 110a and the second fin structures 110b are formed, the second silicon oxide layer 111 may be entirely removed, as shown in FIG. 4, in accordance with some embodiments of the disclosure.

In some embodiments, each first fin structure 110a may include a first portion 101 and an overlying second portion 105. Moreover, the first portion 101 may be formed of a material that is the same as that of the semiconductor substrate 100 (e.g. silicon) and different from that of the second portion 105 which may be formed of a semiconductor material, such as an III-V group or IV group semiconductor material (e.g., silicon germanium (SiGe)). In those cases, the second fin structure 110b may be formed of a material that is the same as that of the semiconductor substrate 100 (e.g. silicon).

It should be noted that the number of first fin structures 110a and the number of second fin structures 110b may be adjusted according to actual application, and it is not limited to two first fin structures 110a in the first region 100a and two second fin structures 110b in the second region 100b shown in FIG. 4.

Afterwards, an optional semiconductor capping layer (not shown) may be conformally formed over the first fin structures 110a and the second fin structures 110b, in accordance with some embodiments. In addition, the semiconductor capping layer is formed over the bottom of the trenches 111a, 111b, and 111c in the first region 100a and/or the second region 100b. In some embodiments, the semiconductor capping layer includes a layer of silicon. Therefore, the semiconductor capping layer may also be referred to as a silicon liner. Any suitable deposition method, such as CVD, PVD, ALD, the like, or a combination thereof, may be used to form the semiconductor capping layer.

Figure 5:
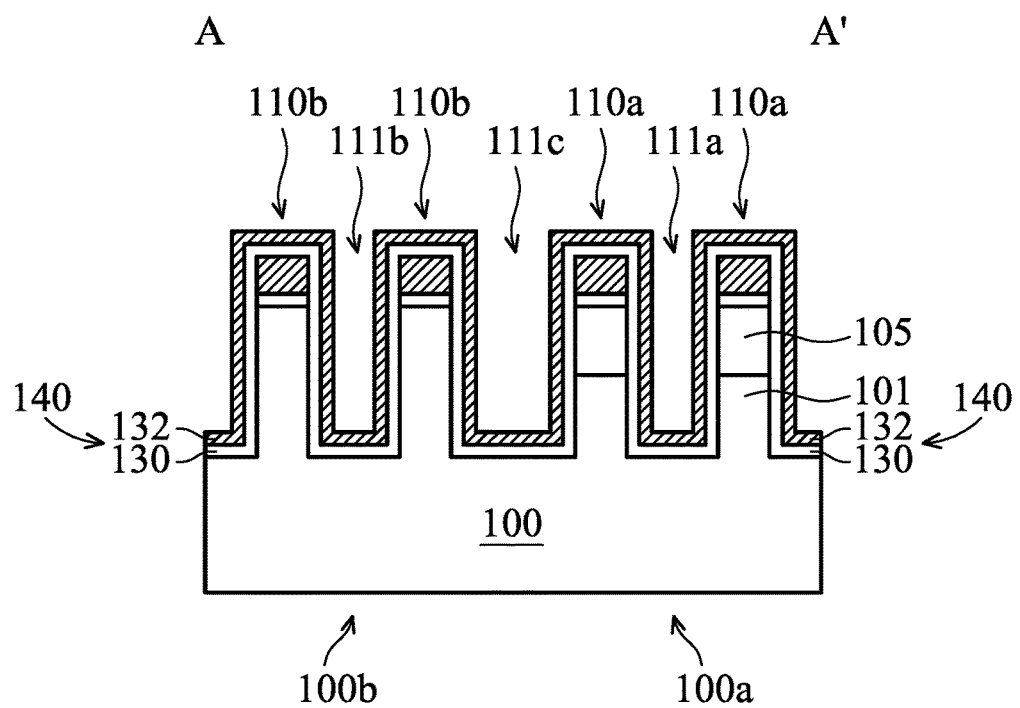

As shown in FIG. 5, in some embodiments, after the second silicon oxide layer 111 is entirely removed (as shown in FIG. 4) or after the semiconductor capping layer is formed, a liner structure 140 is conformally formed over the structure shown in FIG. 4 or the semiconductor capping layer that covering the structure shown in FIG. 4. The liner structure 140 may serve as a shallow trench isolation (STI) liner and a protective layer for the fin structures. In some embodiments, the formation of the liner structure 140 includes conformally forming a first liner layer 130 covering the semiconductor substrate 100, the first fin structures 110a, the second fin structures 110b, and the patterned masking structure (which includes the silicon oxide layer 107 and the silicon nitride layer 109). More specifically, the first liner layer 130 is conformally formed over the sidewalls of the patterned masking structure, the first fin structures 110a, and the second fin structures 110b, and over the top surface of the patterned masking structure. Moreover, the formation of the liner structure 140 further includes conformally forming a second liner layer 132 over the first liner layer 130. In some embodiments, the first liner layer 130 has a thickness that is in a range from about 10 Å to 20 Å, and the second liner layer 132 has a thickness that is in a range from about 20 Å to 40 Å.

In some embodiments, the first liner layer 130 is a silicon oxide ($SiO_2$) film, a silicon carbide (SiC) film, or a carbon-doped silicon oxide (SiOC) film. In those cases, the second liner layer 132 may be a nitrogen-containing film or a carbon-containing film, such as a silicon nitride (SiN or $Si_3N_4$) film, a carbon-doped silicon nitride (SiCN) film, a silicon oxynitride (SiON) film, or a carbon-doped silicon oxynitride (SiCON) film.

In some embodiments, the first liner layer 130 is formed by a thermal oxidation process or a deposition process including CVD, PVD, ALD, the like, or a combination thereof. An optional rapid thermal treatment may be performed on the first liner layer 130 to improve the film quality.

In some embodiments, after the first liner layer 130 is formed, the second liner layer 132 is formed by an in-situ or ex-situ deposition process including CVD, PVD, ALD, the like, or a combination thereof. In some alternative embodiments, the second liner layer 132 is formed by performing an in-situ nitridation treatment on the first liner layer 130 that includes silicon oxide ($SiO_2$) or carbon-doped silicon oxide (SiOC). In those cases, the second liner layer 132 is an oxynitride-containing film that includes silicon oxynitride (SiON) or carbon-doped silicon oxynitride (SiOCN). In some embodiments, the in-situ nitridation treatment may be performed using a nitrogen-containing gas (such as $N_2$, NO, $N_2O$, or $NH_3$).

The first liner layer 130 including silicon oxide may block or reduce the charges trapped in the second liner layer 132 including silicon nitride or oxynitride from diffing into the first fin structures 110a and the second fin structures 110b, thereby reducing leakage in the semiconductor device.

Moreover, the second liner layer 132 including silicon nitride or oxynitride may serve as an oxidation-resist layer to prevent the first fin structures 110a and the second fin structures 110b from being damaged (e.g., oxidized) due to the subsequent high temperature process (e.g., the steam anneal process for shallow trench isolation (STI) which is sometimes referred to as STI steam anneal process). If the second liner layer 132 is not formed, the first liner layer 130 made of silicon oxide is not robust enough to protect the first fin structures 110a including an III-V group or IV group semiconductor material (e.g., silicon germanium (SiGe)). Silicon germanium (SiGe) is easily oxidized to form germanium oxide (GeOx) during the subsequent annealing process (e.g., STI steam anneal process). Once the germanium oxide (GeOx) is formed, it is easily removed by the etching process. Therefore, the profiles or shape of the first fin structures 110a will be changed.

In addition, when the liner structure 140 is doped with carbon, the dielectric constant of the liner structure 140 is reduced. Since the capacitance of the liner structure 140 is proportional to dielectric constant of the liner structure 140 and the number of charges in the second liner layer 132 including silicon nitride or oxynitride is also proportional to capacitance of the liner structure 140, the number of charges in the second liner layer 132 can be reduced when the liner structure 140 includes carbon doped therein.

Figure 6:
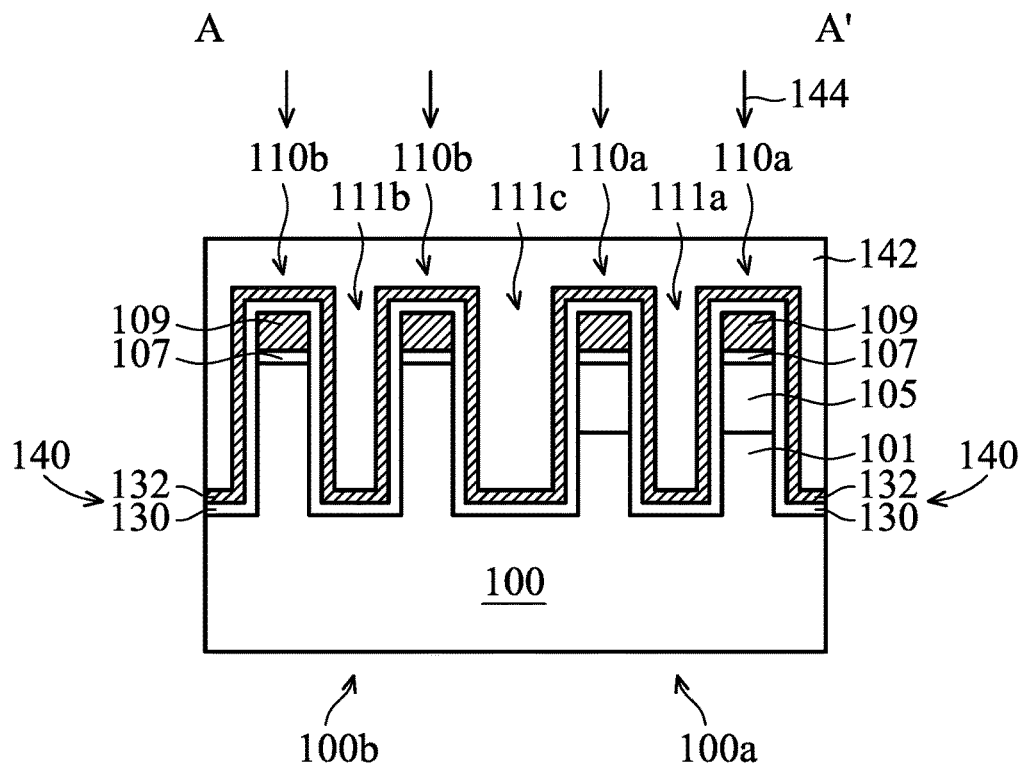

After the liner structure 140 is formed, an insulating layer 142 is formed over the first and second fin structures 110a and 110b that are covered by the liner structure 140, as shown in FIG. 6, in accordance with some embodiments. The insulating layer 142 also fills the trenches 111a, 111b, and 111c. In some embodiments, the insulating layer 142 may be formed of silicon oxide, silicon nitride, low-k dielectric materials, or a combination thereof, and may be formed by a flowable CVD (FCVD) process. Other insulating materials and/or other formation processes may be used.

After the insulating layer 142 is formed, an anneal process 144 is performed to cure the insulating layer 142, as shown in FIG. 6, in accordance with some embodiments. The anneal process 144 may include a wet steam anneal, and a subsequent dry anneal process. In some embodiments, the wet steam anneal process (e.g., a thermal anneal process performed in an environment including oxidant gas contained steam) is performed at a temperature in a range from about 150° C. to about 950° C., for more than 0.5 hour. In addition, the dry anneal process is performed in an ambient atmosphere comprising nitrogen (e.g., $N_2$), at a temperature in a range from about, for more than 0.5 hour.

In some embodiments, since the second liner layer 132 of the liner structure 140 includes nitride or oxynitride which blocks oxygen that comes from the wet steam used during the anneal process 144, the material of the first and/or second fin structures 110a and/or 110b can be protected from being oxidized.

Figure 7:
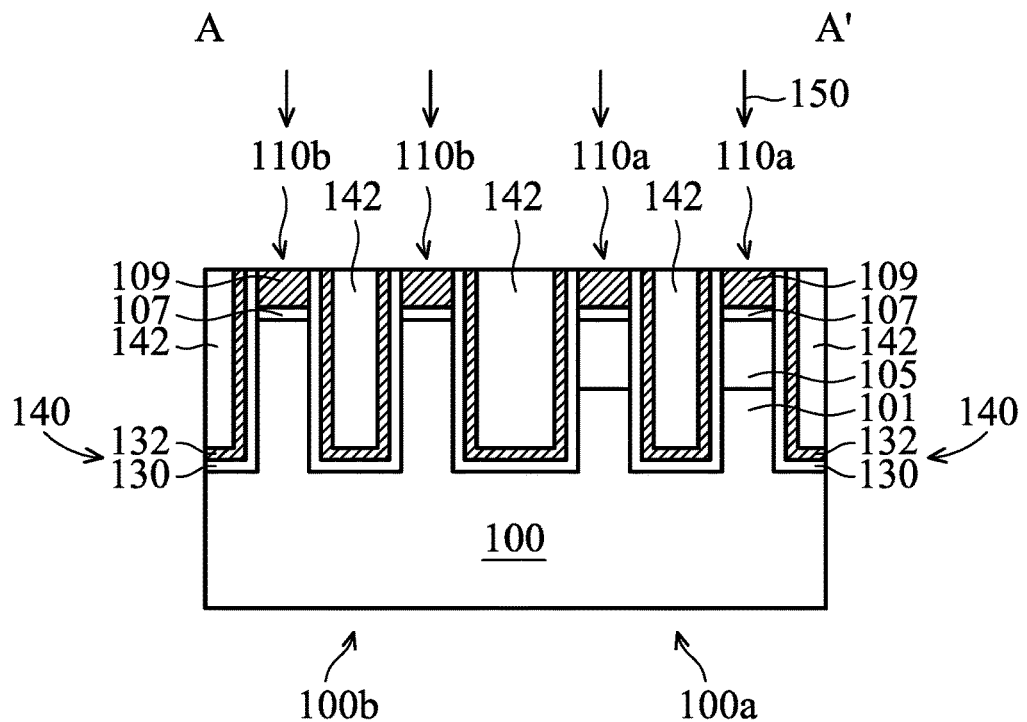

Afterwards, the insulating layer 142 and the liner structure 140 over the top surfaces of the first structures 110a and the second fin structures 110b are removed by a planarization process, as shown in FIG. 7, in accordance with some embodiments. The planarization process, such as CMP, is performed until the top surface of the silicon nitride layer 109 is exposed. After performing the planarization process, the top surface the insulating layer 142 is substantially level with the top surfaces of silicon nitride layer 109.

Afterwards, another anneal process 150 may optionally be performed on the insulating layer 142, as shown in FIG. 7 in accordance with some embodiments. The anneal process 150 may help to further cure the insulating layer 142. The anneal process 150 may be performed under the same conditions as the anneal process 144.

Figure 8:
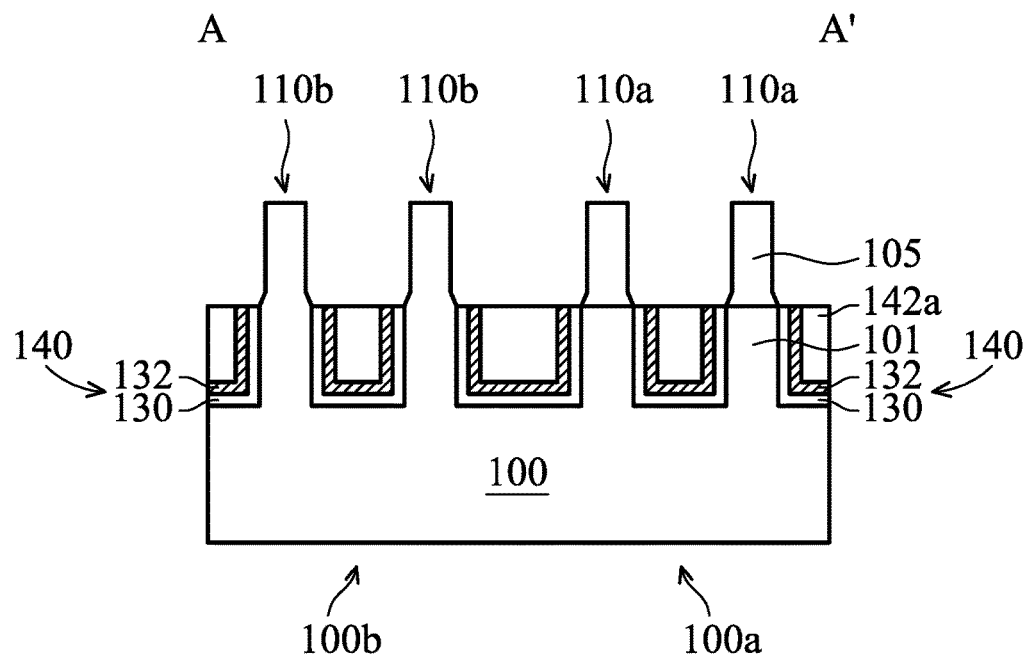

The patterned masking structure including the first silicon oxide layer 107 and the silicon nitride layer 109 (FIG. 7) in the first region 100a and the second region 100b are removed by an etching process, as shown in FIG. 8, in accordance with some embodiments. In some embodiments, the etching process includes a wet etching process or a dry etching process.

Afterwards, a portion of the insulating layer 142 and a portion of the liner structure 140 are removed to expose the second portions 105 of the first fin structures 110a in the first region 100a and upper portions of the second fin structures 110b in the second region 100b as shown in FIG. 8, in accordance with some embodiments. As a result, an isolation feature 142a is formed. In some embodiments, the insulating layer 142 and the liner structure 140 are removed by an etching process such as a dry etching process or a wet etching process, so as to form isolation regions such as shallow trench isolation (STI) regions, as shown in FIG. 8, in accordance with some embodiments. In some embodiments, the etching process includes a dry etching process using an etching gas comprising ammonia (e.g. $NH_3$) and hydrogen fluoride (HF).

In some embodiments, the isolation region includes an isolation feature 142a and a liner structure 140. The isolation feature 142a covers the semiconductor substrate 100, the first portions 101 of the first fin structures 110a in the first region 100a, and lower portions of the second fin structures 110b in the second region 100b. The liner structure 140 above the isolation feature 142a is removed, so that the second portions 105 of the first fin structures 110a and the upper portions of the second fin structures 110b are exposed from the isolation region.

Figure 9:
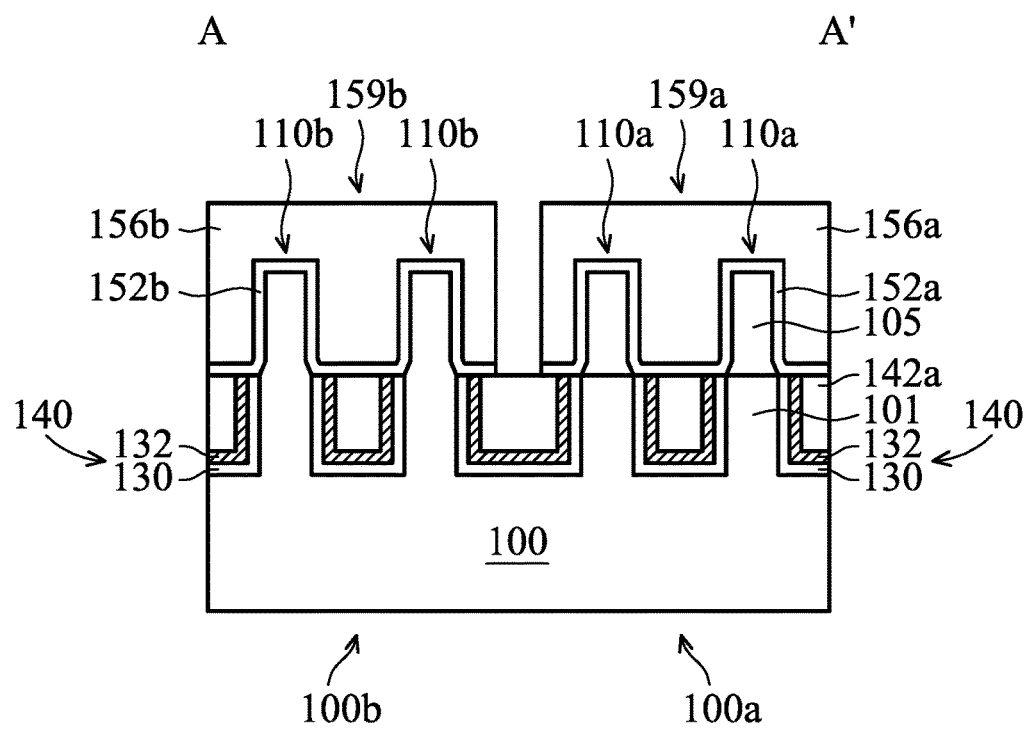

Afterwards, a gate structure 159a is formed over the first fin structures 110a in the first region 100a and a gate structure 159b is formed over the second fin structures 110b in the second region 100b, as shown in FIG. 9, in accordance with some embodiments. In some embodiments, the gate structure 159a may include a dummy gate dielectric layer 154a, a dummy gate electrode layer 156a over the dummy gate dielectric layer 154a, and gate spacers 158a (not shown in FIG. 9) formed on opposite sidewalls of the dummy gate electrode layer 156a. Similarly, the gate structure 159b may include a dummy gate dielectric layer 154b, a dummy gate electrode layer 156b over the dummy gate dielectric layer 154b, and gate spacers 158b (not shown in FIG. 9) formed on opposite sidewalls of the dummy gate electrode layer 156b.

As a result, the gate structure 159a is formed on the middle portion of the first fin structures 110a in the first region 100a and the gate structure 159b is formed on the middle portion of the second fin structures 110b in the second region 100b. The middle portion of each first fin structure 110a which is surrounded or wrapped by the gate structure 159a is a channel region of a P-type FinFET. The middle portion of each second fin structure 110b which is surrounded or wrapped by the gate structure 159b is a channel region of an N-type FinFET. The dummy gate dielectric layer 154a is formed between the isolation regions and the dummy gate electrode layer 156a. The dummy gate dielectric layer 154b is formed between the isolation regions and the dummy gate electrode layer 156b.

In some embodiments, the dummy gate dielectric layers 154a and 154b are formed of dielectric materials, such as silicon oxide, silicon nitride, silicon oxynitride, dielectric material with high dielectric constant (high-k), or combinations thereof. The dummy gate dielectric layers 154a and 154b may be formed by a deposition process, such as CVD, PVD, ALD, high density plasma CVD (HDPCVD), metal organic CVD (MOCVD), or plasma enhanced CVD (PECVD).

In some embodiments, the dummy gate electrode layers 156a and 156b are formed of conductive or non-conductive materials. In some embodiments, the dummy gate electrode layers 156a and 156b are formed of polysilicon. The dummy gate electrode layers 156a and 156b are formed by a deposition process, such as CVD, PVD, ALD, HDPCVD, MOCVD, or PECVD.

Afterwards, in some embodiments, a portion of each first fin structure 110a exposed from and adjacent to the gate structure 159a is removed to form a recess (not shown), and a source/drain (S/D) feature (not shown) is formed in the recess. A portion of each second fin structure 110b exposed from and adjacent to the gate structure 159b is removed to form a recess (not shown), and a source/drain (S/D) feature (not shown) is formed in the recess.

In some embodiments, the source/drain features include silicon germanium (SiGe), germanium (Ge), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof.

Afterwards, in some embodiments, an interlayer dielectric (ILD) layer (not shown) is formed on the gate structures 159a and 159b and the source/drain features. The ILD layer may be formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

Afterwards, in some embodiments, a gate-last process (sometimes referred to as a replacement gate process) is performed. In the gate-last process, the dummy gate electrode layers 156a and 156b and the dummy gate dielectric layers 154a and 154b are removed to form trenches. Afterwards, in some embodiments, a gate dielectric layer and gate electrode layer are formed in each trench. As a result, P-type FinFETs (PMOS devices) are formed in the first region 100a and N-type FinFETs (NMOS devices) are formed in the second region 100b.

In some embodiments, the gate dielectric layer includes silicon oxide, silicon nitride, or a high-k dielectric material including a metal oxide or a silicate of Hf, Al, Zr, La, Mg, Ba, Ti, Pb, or a combination thereof. The formation methods of gate dielectric layer may include CVD, ALD, PECVD, and the like.

In some embodiments, the gate electrode layer may be made of a metal-containing material such as TiN, TaN, TaC, Co, Ru, Al, combinations thereof, or multi-layers thereof, and may be formed by, e.g., electroplating, electroless plating, or other suitable method.

Figure 10:
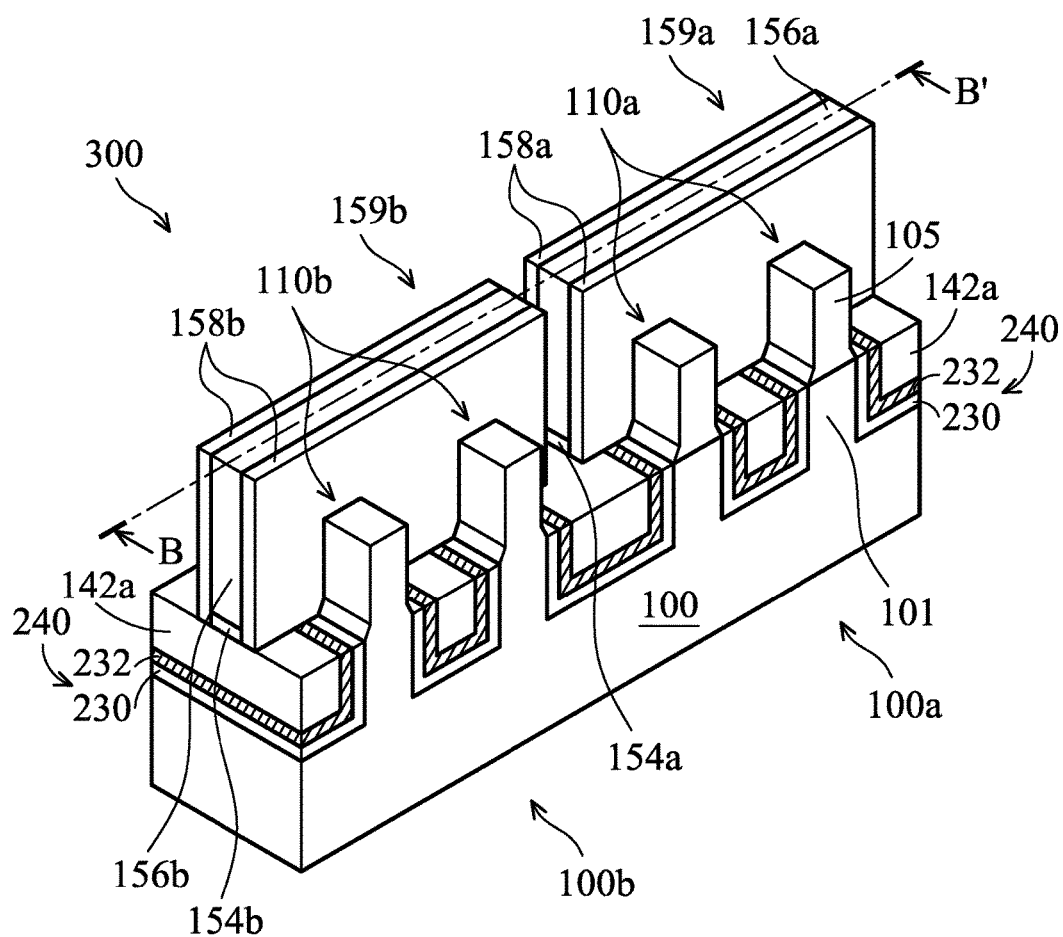
FIG. 10 is a perspective view of a semiconductor device structure with fin field-effect transistors (FinFETs) in accordance with some embodiments.
Figure 11:
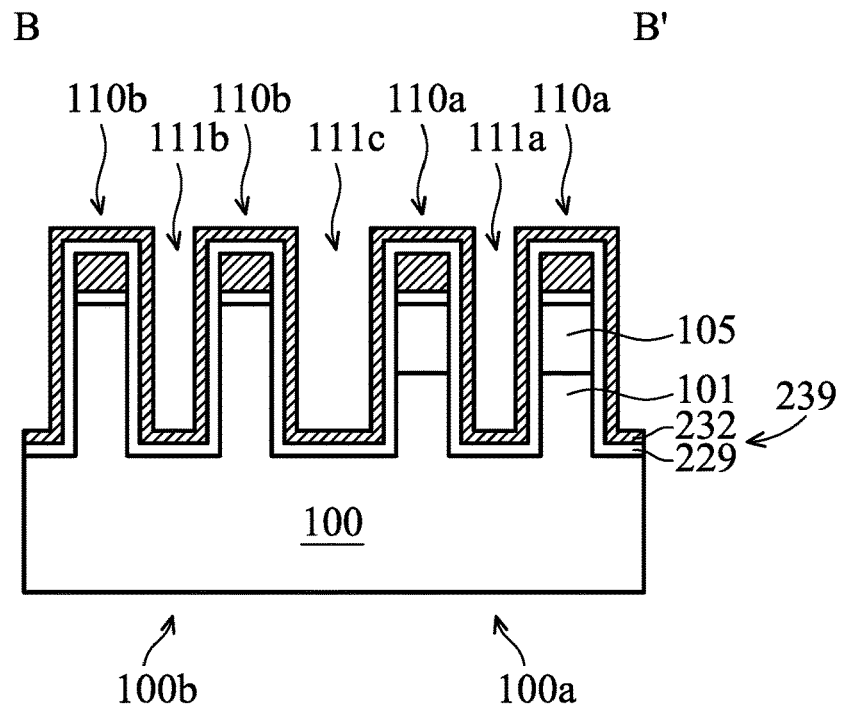
FIG. 11, FIG. 12, and FIG. 13 are cross-sectional views showing various stages of a method of forming a semiconductor device structure with FinFETs in accordance with some embodiments.
Figure 12:
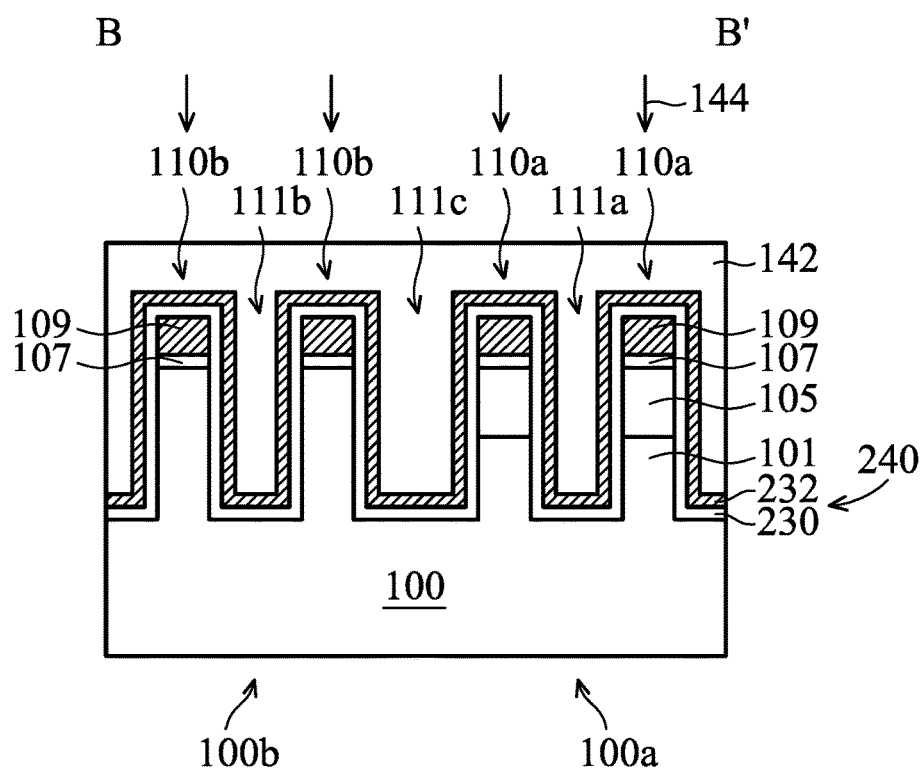
Figure 13:
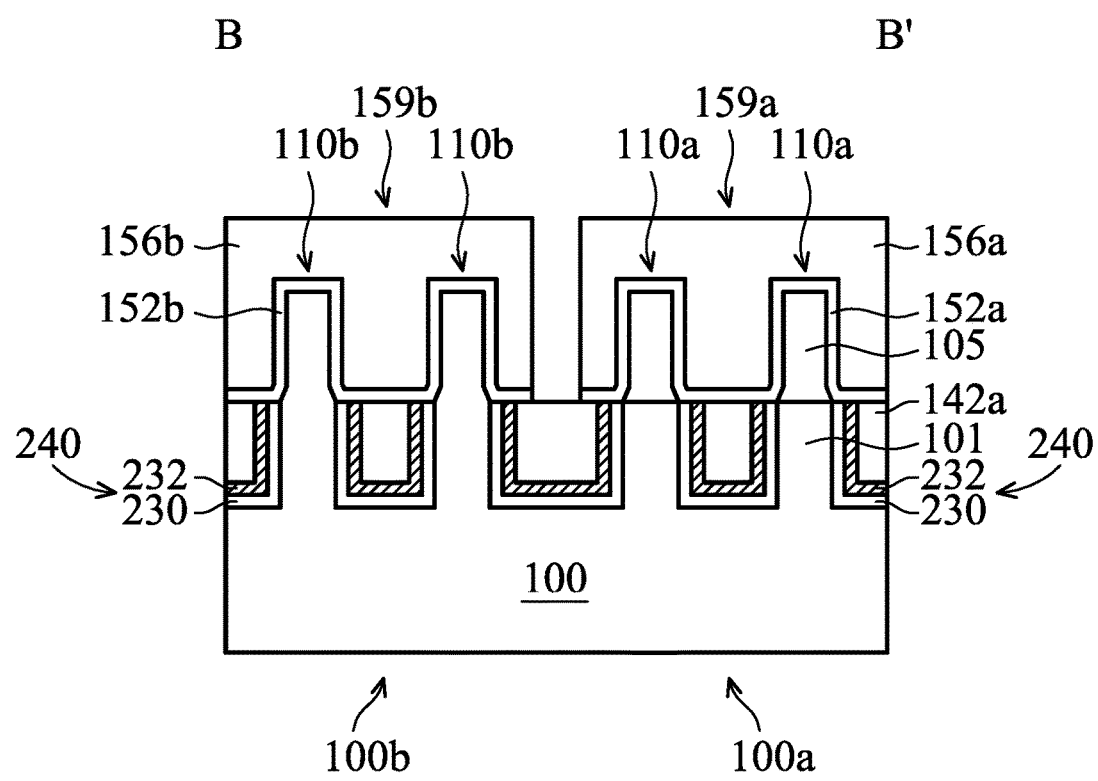

FIG. 10 is a perspective view of a semiconductor device structure 300 including fin field-effect transistors (FinFETs) in accordance with some embodiments. FIGS. 11, 12, and 13 are cross-sectional views along line B-B' of FIG. 10 to show various stages of a process for forming the semiconductor device structure 300, in accordance with some embodiments. In some embodiments, a gate-replacement process is employed to fabricate the semiconductor device structure 300.

As shown in FIG. 10, the semiconductor device structure 300 may be similar to the semiconductor device structure 200 shown in FIG. 1 where like reference numbers indicate like elements formed using like processes. In some embodiments, the semiconductor device structure 300 includes a liner structure 240. The liner structure 240 includes an oxidized first liner layer 230 and a second liner layer 232 over the first liner layer 230. In some embodiments, the oxidized first liner layer 230 is a silicon oxide ($SiO_2$) film or a carbon-doped silicon oxide (SiOC) film. In those cases, the second liner layer 232 may be a nitrogen-containing film or a carbon-containing film, such as a silicon nitride (SiN or $Si_3N_4$) film, a carbon-doped silicon nitride (SiCN) film, a silicon oxynitride (SiON) film), or a carbon-doped silicon oxynitride (SiCON) film.

As shown in FIG. 11, a structure as shown in FIG. 4 is received. In some embodiments, a liner structure 239 is conformally formed over the structure. The liner structure 239 may be employed to form an STI liner and a protective layer for the fin structures. In some embodiments, the formation of the liner structure 239 includes conformally forming a first liner layer 229 covering the semiconductor substrate 100, the first fin structures 110a, the second fin structures 110b, and the patterned masking structure (which includes the silicon oxide layer 107 and the silicon nitride layer 109). More specifically, the first liner layer 229 is conformally formed over the sidewalls of the patterned masking structure, the first fin structures 110a, and the second fin structures 110b, and over the top surface of the patterned masking structure. Moreover, the formation of the liner structure 239 further includes conformally forming a second liner layer 232 over the first liner layer 229.

In some embodiments, the first liner layer 229 is a crystalline silicon (c-Si) film, a polycrystalline silicon (poly-silicon) film, or an amorphous silicon (α-Si) film. Alternatively, the first liner layer 229 is a carbon-doped silicon film. The second liner layer 232 may be a nitrogen-containing film or a carbon-containing film, such as a silicon nitride (SiN or $Si_3N_4$) film, a carbon-doped silicon nitride (SiCN) film, a silicon oxynitride (SiON) film, or a carbon-doped silicon oxynitride (SiCON) film.

In some embodiments, the first liner layer 229 is formed by a deposition process including CVD, ALD, epitaxial growth, the like, or a combination thereof. The first liner layer 229 that is formed of silicon may serve as a supporting layer to prevent the fin structures from bending.

In some embodiments, after the first liner layer 229 is formed, the second liner layer 232 is formed by an in-situ or ex-situ deposition process including CVD, PVD, ALD, the like, or a combination thereof. In some alternative embodiments, the second liner layer 232 is formed by performing an in-situ surface treatment (e.g., an in-situ plasma treatment) on the first liner layer 229. In some embodiments, the in-situ surface treatment may be performed using a nitrogen-containing gas (such as $N_2$, NO, $N_2O$, or $NH_3$) as a process gas. In some embodiments, the in-situ surface treatment is performed at a temperature in a range of between about 60° C. and 300° C., at a RF power in a range of between about 15 W and 500 W, and for a time in a range of between about 10 seconds and 100 seconds.

After the liner structure 239 is formed, an insulating layer 142 is formed over the first and second fin structures 110a and 110b that are covered by the liner structure 239, as shown in FIG. 12, in accordance with some embodiments. The insulating layer 142 also fills the trenches 111a, 111b, and 111c. After the insulating layer 142 is formed, an anneal process 144 (which includes a wet steam anneal, and a subsequent dry anneal process) is performed to cure the insulating layer 142, in accordance with some embodiments. After the anneal process 144 is performed, the first liner layer 229 formed of silicon is oxidized to form an oxidized first liner layer 230 (e.g., a silicon oxide film or a carbon-doped silicon oxide film). As a result, a liner structure 240 including the oxidized first liner layer 230 and an overlying second liner layer 232 is formed, as shown in FIG. 12.

The oxidized first liner layer 230 that includes silicon oxide may block or reduce the charges trapped in the second liner layer 232 that includes silicon nitride or oxynitride from diffusing into the first fin structures 110a and the second fin structures 110b, thereby reducing leakage in the semiconductor device.

Moreover, the second liner layer 232 including silicon nitride or oxynitride may serve as an oxidation-resist layer to prevent the first fin structures 110a and the second fin structures 110b from being damaged (e.g., oxidized). In addition, when the liner structure 240 is doped with carbon, the dielectric constant of the liner structure 240 is reduced. Accordingly, the number of charges in the second liner layer 232 can be reduced.

In some embodiments, a rapid thermal treatment may be performed on the first liner layer 229 using oxygen ($O_2$) to oxidize the material of the first liner layer 229 (i.e., silicon), so that a silicon oxide liner layer with improved film quality is formed. In those cases, the silicon oxide liner layer may serve as an oxidation-resist layer to prevent the first fin structures 110a and the second fin structures 110b from being damaged (e.g., oxidized) and therefore the formation of the second liner layer 232 can be skipped.

Afterwards, the processes performed in FIGS. 7 and 8 are performed on the structure shown in FIG. 12. For example, the insulating layer 142 and the liner structure 240 over the top surfaces of the first and second fin structures 110a and 110b may be removed by a CMP process. After the CMP process is performed, another anneal process may optionally be performed on the insulating layer 142. Afterwards, the patterned masking structure including the first silicon oxide layer 107 and the silicon nitride layer 109 in the first region 100a and the second region 100b are removed by an etching process, such as a wet etching process or a dry etching process.

Afterwards, a portion of the insulating layer 142 and a portion of the liner structure 240 are removed to expose the second portions 105 of the first fin structures 110a in the first region 100a and upper portions of the second fin structures 110b in the second region 100b. As a result, an isolation feature 142a is formed.

In some embodiments, the isolation region includes the isolation feature 142a and the liner structure 240. The liner structure 240 above the isolation feature 142a is removed, so that the second portions 105 of the first fin structures 110a and the upper portions of the second fin structures 110b are exposed from the isolation region.

As shown in FIG. 13, a gate structure 159a is formed over the first fin structures 110a in the first region 100a and a gate structure 159b is formed over the second fin structures 110b in the second region 100b by using the method described in FIG. 9, in accordance with some embodiments. As a result, the gate structure 159a is formed on the middle portion of the first fin structures 110a in the first region 100a and the gate structure 159b is formed on the middle portion of the second fin structures 110b in the second region 100b. The middle portion of each first fin structure 110a which is surrounded or wrapped by the gate structure 159a is a channel region of a P-type FinFET. The middle portion of each second fin structure 110b which is surrounded or wrapped by the gate structure 159b is a channel region of an N-type FinFET. The dummy gate dielectric layer 154a is formed between the isolation regions and the dummy gate electrode layer 156a. The dummy gate dielectric layer 154b is formed between the isolation regions and the dummy gate electrode layer 156b.

Figure 14:
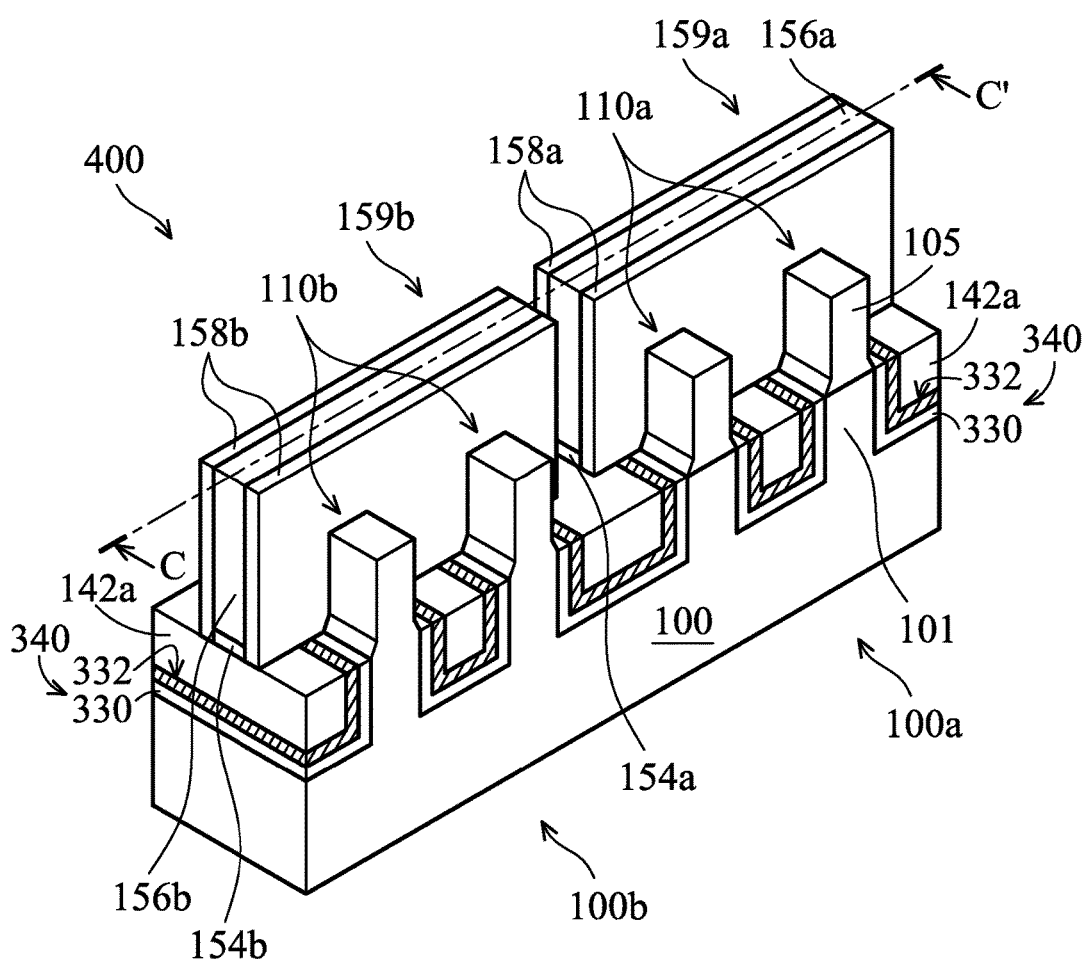
FIG. 14 is a perspective view of a semiconductor device structure with fin field-effect transistors (FinFETs) in accordance with some embodiments.
Figure 15:
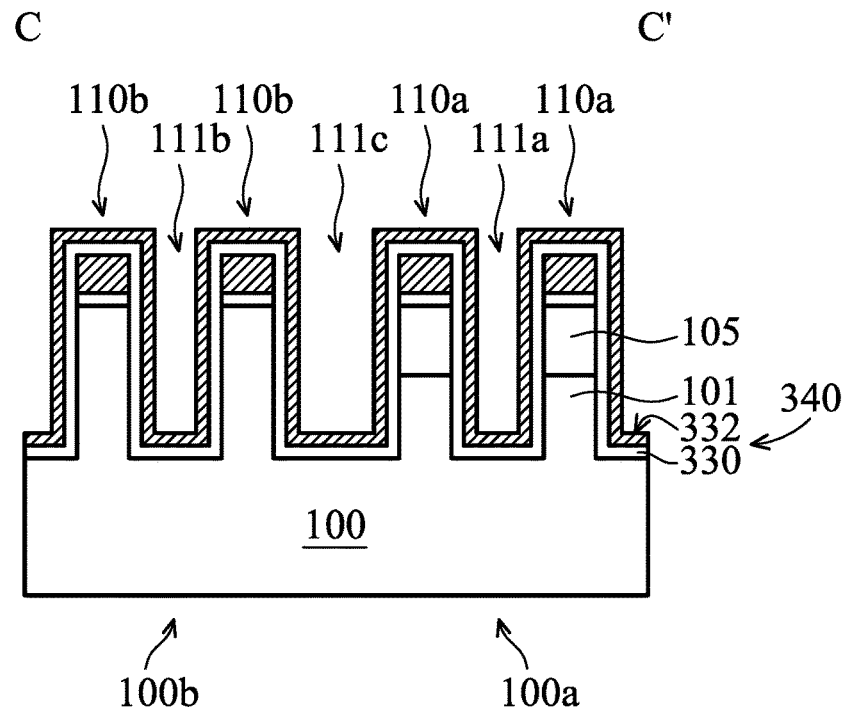
FIG. 15 and FIG. 16 are cross-sectional views showing various stages of a method of forming a semiconductor device structure with FinFETs in accordance with some embodiments.
Figure 16:
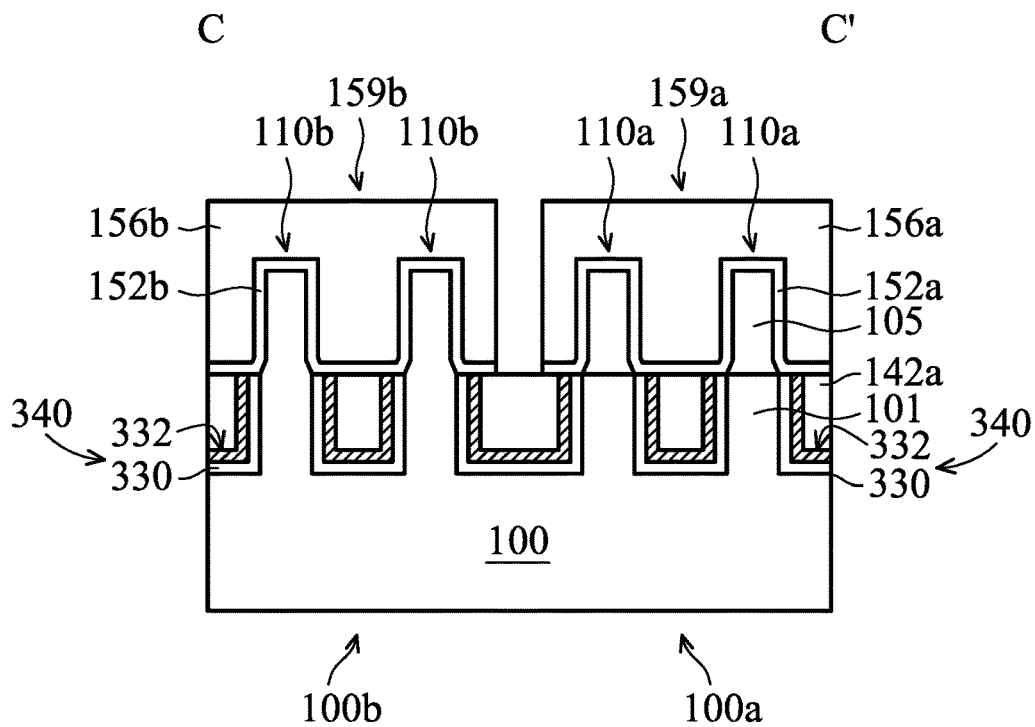

FIG. 14 is a perspective view of a semiconductor device structure 400 including fin field-effect transistors (FinFETs) in accordance with some embodiments. FIGS. 15 and 16 are cross-sectional views along line C-C' of FIG. 14 to show various stages of a process for forming the semiconductor device structure 400, in accordance with some embodiments. In some embodiments, a gate-replacement process is employed to fabricate the semiconductor device structure 400.

As shown in FIG. 14, the semiconductor device structure 400 may be similar to the semiconductor device structure 200 shown in FIG. 1 where like reference numbers indicate like elements formed using like processes. Unlike the semiconductor device structure 200 shown in FIG. 1, the semiconductor device structure 400 includes a liner structure 340. The liner structure 340 includes a single liner layer 330 that may be a silicon oxynitride film and have a nitride surface 332. In some embodiments, the liner layer 330 is a carbon-doped silicon oxynitride (SiCON) film and has a nitride surface 332.

As shown in FIG. 15, a structure as shown in FIG. 4 is received. In some embodiments, a liner structure 340 is conformally formed over the structure. The liner structure 340 may be employed to form an STI liner and a protective layer for the fin structures. In some embodiments, the formation of the liner structure 340 includes conformally forming a liner layer 330 having a nitrided surface region 332 to cover the semiconductor substrate 100, the first fin structures 110a, the second fin structures 110b, and the patterned masking structure (which includes the silicon oxide layer 107 and the silicon nitride layer 109). More specifically, the liner layer 330 having the nitrided surface region 332 is conformally formed over the sidewalls of the patterned masking structure, the first fin structures 110a, and the second fin structures 110b, and over the top surface of the patterned masking structure.

In some embodiments, the liner layer 330 is formed by a cycle process that includes a deposition process followed by in-situ heat treatment. For example, the deposition process in the cycle process is an ALD process using a precursor including nitrogen-, and carbon-containing silane and a reactant gas including oxygen ($O_2$), argon (Ar), and helium (He). The in-situ heat treatment in the cycle process is performed using a process gas including $N_2$, NO, $N_2O$, or $NH_3$. In some embodiments, after the silicon oxynitride (SiON) film is formed, an in-situ surface treatment (e.g., an in-situ plasma treatment) is performed on the silicon oxynitride (SiON) film. In some embodiments, the in-situ surface treatment is an in-situ nitridation treatment and is performed using a process gas including $N_2$, NO, $N_2O$, or $NH_3$, so that the surface of the silicon oxynitride (SiON) film is nitrided. As a result, a liner layer 330 having a nitrided surface region 332 is formed.

After the liner structure 340 is formed, the processes performed in FIGS. 6, 7 and 8 are performed, in accordance with some embodiments. For example, an insulating layer 142 (not shown) is formed over the first and second fin structures 110a and 110b that are covered by the liner structure 340. After the insulating layer 142 is formed, an anneal process is performed to cure the insulating layer 142.

The liner layer 330 having the nitrided surface region 332 may serve as an oxidation-resist layer to prevent the first fin structures 110a and the second fin structures 110b from being damaged (e.g., oxidized). Moreover, the nitrided surface region 332 provides an adhesion between the insulating layer 142 and the liner layer 330. In addition, when the liner structure 330 is doped with carbon, the dielectric constant of the liner structure 330 is also reduced.

The insulating layer 142 and the liner structure 240 over the top surfaces of the first and second fin structures 110a and 110b may be removed by a CMP process. After the CMP process is performed, another anneal process may optionally be performed on the insulating layer 142. Afterwards, the patterned masking structure including the first silicon oxide layer 107 and the silicon nitride layer 109 in the first region 100a and the second region 100b are removed by an etching process, such as a wet etching process or a dry etching process.

Afterwards, a portion of the insulating layer 142 and a portion of the liner structure 340 are removed to expose the second portions 105 of the first fin structures 110a in the first region 100a and upper portions of the second fin structures 110b in the second region 100b. As a result, an isolation feature 142a is formed.

In some embodiments, the isolation region includes the isolation feature 142a and the liner structure 340. The liner structure 340 above the isolation feature 142a is removed, so that the second portions 105 of the first fin structures 110a and the upper portions of the second fin structures 110b are exposed from the isolation region.

As shown in FIG. 16, a gate structure 159a is formed over the first fin structures 110a in the first region 100a and a gate structure 159b is formed over the second fin structures 110b in the second region 100b by using the method described in FIG. 9, in accordance with some embodiments. As a result, the gate structure 159a is formed on the middle portion of the first fin structures 110a in the first region 100a and the gate structure 159b is formed on the middle portion of the second fin structures 110b in the second region 100b. The middle portion of each first fin structure 110a which is surrounded or wrapped by the gate structure 159a is a channel region of a P-type FinFET. The middle portion of each second fin structure 110b which is surrounded or wrapped by the gate structure 159b is a channel region of an N-type FinFET. The dummy gate dielectric layer 154a is formed between the isolation regions and the dummy gate electrode layer 156a. The dummy gate dielectric layer 154b is formed between the isolation regions and the dummy gate electrode layer 156b.

Embodiments of a semiconductor device structure and a method for forming the same are provided. First fin structures protrude from a first region (e.g., a PMOS region) of a semiconductor substrate and each first fin structure includes a channel region. Second fin structures protrude from a second region (e.g., an NMOS region) of the semiconductor substrate and each second fin structure includes a channel region. In some embodiments, a liner structure including a first liner layer and an overlying second liner layer is formed between isolation features (e.g., STI features) and the first and second fin structures, so as to protect the channel regions of the first and second fin structures from being damaged. In some embodiments, the liner structure includes a single liner layer with a nitride surface region. According to the foregoing embodiments of the disclosure, the second liner layer including silicon nitride or oxynitride or the liner layer including oxynitride and having a nitride surface region prevents the first and second fin structures from being oxidized due to the subsequent high temperature process (e.g., STI steam anneal process).

According to foregoing embodiments of the disclosure, the first liner layer, which includes silicon oxide, may block or reduce the charges trapped in the second liner layer, which including silicon nitride or oxynitride, from diffusing into the first and second fin structures, thereby reducing leakage in the semiconductor device.

According to foregoing embodiments of the disclosure, since the liner structure is doped with carbon, the dielectric constant of the liner structure is reduced. As a result, the number of charges in the second liner layer can be reduced, thereby reducing further leakage.

In some embodiments, a semiconductor device structure is provided. The semiconductor device structure includes a first fin structure protruding from a semiconductor substrate. The fin structure includes a first portion and an overlying second portion. The first portion is formed of a material that is the same as that of the semiconductor substrate and different from that of the second portion. The semiconductor device structure also includes a liner structure and an isolation feature. The liner structure includes a carbon-doped silicon oxide film covering the semiconductor substrate and the first portion of the first fin structure and a nitrogen-containing film over the carbon-doped silicon oxide film. The isolation feature is over the nitrogen-containing film and surrounded by the liner structure.

In some embodiments, a semiconductor device structure is provided. The semiconductor device structure includes a first fin structure protruding from a first region of a semiconductor substrate. The first fin structure includes a first portion and an overlying second portion and the first portion is formed of a material that is the same as that of the semiconductor substrate and different from that of the second portion. The semiconductor device structure also includes a liner structure and an isolation feature. The liner structure includes a silicon oxide film covering the semiconductor substrate and the first portion of the first fin structure and a carbon-containing film over the silicon oxide film. The isolation feature is over the carbon-containing film and surrounded by the liner structure.

In some embodiments, a semiconductor device structure is provided. The semiconductor device structure includes a first fin structure protruding from a first region of a semiconductor substrate. The first fin structure includes a first portion and an overlying second portion and the first portion is formed of a material that is the same as that of the semiconductor substrate and different from that of the second portion. The semiconductor device structure also includes a liner structure and an isolation feature. The liner structure includes a silicon oxynitride film having a nitrided surface region and covering the semiconductor substrate and the first portion of the first fin structure. The isolation feature is over the nitrided surface region of the silicon oxynitride film and surrounded by the liner structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a first fin structure protruding from a first region of a semiconductor substrate, wherein the first fin structure comprises a first portion and an overlying second portion and the first portion is formed of a material that is the same as that of the semiconductor substrate and different from that of the second portion;
   a liner structure, comprising:
   a carbon-doped silicon oxide film covering and in direct contact with the semiconductor substrate and the first portion of the first fin structure; and
   a nitrogen-containing film over the carbon-doped silicon oxide film; and
   an isolation feature over the nitrogen-containing film and surrounded by the liner structure.

2. The semiconductor device structure as claimed in claim 1, further comprising:
   a second fin structure protruding from a second region of the semiconductor substrate,
   wherein the second fin structure is formed of a material that is the same as that of the semiconductor substrate, and
   wherein the liner structure further covers a lower portion of the second fin structure, so that the lower portion of the second fin structure is spaced apart from the isolation feature by the liner structure.

3. The semiconductor device structure as claimed in claim 2, wherein the second portion of the first fin structure is formed of an III-V group or IV group semiconductor material and the second fin structure is formed of silicon.

4. The semiconductor device structure as claimed in claim 2, wherein the first region is a PMOS region and the second region is an NMOS region.

5. The semiconductor device structure as claimed in claim 1, wherein the nitrogen-containing film comprises silicon nitride, carbon-doped silicon nitride, silicon oxynitride or carbon-doped silicon oxynitride.

6. The semiconductor device structure as claimed in claim 1, wherein the second portion of the first fin structure is formed of silicon germanium (SiGe) and the first portion of the first fin structure is formed of silicon.

7. The semiconductor device structure as claimed in claim 1, further comprising a gate structure over each of the first fin structure and the second fin structure, wherein the gate structure comprises:
   a gate dielectric layer;
   a gate electrode layer over the gate dielectric layer; and
   gate spacers on opposing sidewalls of gate electrode layer.

8. A semiconductor device structure, comprising:
   a first fin structure protruding from a first region of a semiconductor substrate, wherein the first fin structure comprises a first portion and an overlying second portion and the first portion is formed of a material that is the same as that of the semiconductor substrate and different from that of the second portion;
   a liner structure, comprising:
   a silicon oxide film covering and in direct contact with the semiconductor substrate and the first portion of the first fin structure; and
   a carbon-containing film over the silicon oxide film; and
   an isolation feature over the carbon-containing film, and surrounded by the liner structure.

9. The semiconductor device structure as claimed in claim 8, further comprising:
   a second fin structure protruding from a second region of the semiconductor substrate,
   wherein the second fin structure is formed of a material that is the same as that of the semiconductor substrate,
   wherein the liner structure further covers a lower portion of the second fin structure, so that the lower portion of the second fin structure is spaced apart from the isolation feature by the liner structure.

10. The semiconductor device structure as claimed in claim 9, wherein the second portion of the first fin structure is formed of an III-V group or IV group semiconductor material and the second fin structure is formed of silicon.

11. The semiconductor device structure as claimed in claim 10, wherein the first region is a PMOS region and the second region is an NMOS region.

12. The semiconductor device structure as claimed in claim 8, wherein the carbon-containing film is a SiC, SiCN or SiCON film.

13. The semiconductor device structure as claimed in claim 8, wherein the second portion of the first fin structure is formed of silicon germanium (SiGe) and the first portion of the first fin structure is formed of silicon.

14. The semiconductor device structure as claimed in claim 8, further comprising a gate structure over each of the first fin structure and the second fin structure, wherein the gate structure comprises:
a gate dielectric layer;
a gate electrode layer over the gate dielectric layer; and
gate spacers on opposing sidewalls of gate electrode layer.

15. A semiconductor device structure, comprising:
a first fin structure protruding from a first region of a semiconductor substrate, wherein the first fin structure comprises a first portion and an overlying second portion and the first portion is formed of a material that is the same as that of the semiconductor substrate and different from that of the second portion;
a liner structure, comprising:
a silicon oxynitride film having a nitrided surface region and covering and in direct contact with the semiconductor substrate and the first portion of the first fin structure; and
an isolation feature over the nitrided surface region of the silicon oxynitride film and surrounded by the liner structure.

16. The semiconductor device structure as claimed in claim 15, further comprising:
a second fin structure protruding from a second region of the semiconductor substrate,
wherein the second fin structure is formed of a material that is the same as that of the semiconductor substrate, and
wherein the liner structure further covers a lower portion of the second fin structure, so that the lower portion of the second fin structure is spaced apart from the isolation feature by the liner structure.

17. The semiconductor device structure as claimed in claim 16, wherein the second portion of the first fin structure is formed of an III-V group or IV group semiconductor material and the second fin structure is formed of silicon.

18. The semiconductor device structure as claimed in claim 15, wherein the silicon oxynitride film is a carbon-doped silicon oxynitride film.

19. The semiconductor device structure as claimed in claim 15, wherein the second portion of the first fin structure is formed of silicon germanium (SiGe) and the first portion of the first fin structure is formed of silicon.

20. The semiconductor device structure as claimed in claim 15, further comprising a gate structure over each of the first fin structure and the second fin structure, wherein the gate structure comprises:
a gate dielectric layer;
a gate electrode layer over the gate dielectric layer; and
gate spacers on opposing sidewalls of gate electrode layer.

* * * * *